United States Patent
Bernstein et al.

(10) Patent No.: US 6,404,236 B1
(45) Date of Patent: Jun. 11, 2002

(54) DOMINO LOGIC CIRCUIT HAVING MULTIPLICITY OF GATE DIELECTRIC THICKNESSES

(75) Inventors: Kerry Bernstein, Underhill; Andres Bryant, Essex Junction; Robert J. Gauthier, Jr., Hinesburg; Edward Joseph Nowak, Essex Junction, all of VT (US); Minh Ho Tong, Fuquay-Varina, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,967

(22) Filed: Mar. 19, 2001

(51) Int. Cl.[7] .............................................. H03K 19/096

(52) U.S. Cl. .......................................... 326/98; 326/95

(58) Field of Search .............................. 326/93, 95, 98, 326/83, 27

(56) References Cited

U.S. PATENT DOCUMENTS

| 3,875,426 | A | | 4/1975 | Baitinger et al. |
|---|---|---|---|---|
| 5,287,536 | A | | 2/1994 | Schreck et al. |
| 5,814,846 | A | | 9/1998 | Essbaum et al. |
| 6,051,456 | A | | 4/2000 | Davies et al. |
| 6,229,340 | B1 | * | 5/2001 | Hagihara ..................... 326/93 |

* cited by examiner

Primary Examiner—Michael Tokar
Assistant Examiner—Daniel D. Chang
(74) Attorney, Agent, or Firm—Richard A. Henkler; Bracewell & Patterson, L.L.P.

(57) ABSTRACT

A domino logic circuit having a clocked precharge is disclosed. The domino logic circuit includes a precharge transistor, an isolation transistor, and multiple evaluate transistors. Connected to a power supply, the precharge transistor receives a clock input. The isolation transistor is connected to ground and also receives the clock input. Each of the input transistors, which are coupled between the precharge transistor and the isolation transistor, receives a signal input. The gate dielectric thickness of the evaluate transistors is less than the gate dielectric thickness of the precharge transistor.

8 Claims, 2 Drawing Sheets

DOMINO LOGIC CIRCUIT HAVING MULTIPLICITY OF GATE DIELECTRIC THICKNESSES

BACKGROUND OF THE INVENTION

1. Technical Field

The present invention relates to semiconductor integrated circuits in general, and in particular to domino logic circuits. Still more particularly, the present invention relates to a domino logic circuit having a multiplicity of gate dielectric thicknesses.

2. Description of the Prior Art

Domino logic circuits are commonly found in integrated circuits. A domino logic circuit simplifies digital logic by connecting a number of transistors together in series to implement digital combination logic. For example, a domino logic circuit implements a logic AND function by simply cascading a P-channel transistor with several N-channel evaluate transistors in series. During operation, the P-channel transistor is clocked to precharge an output node of the circuit to a predetermined logic state. Depending on the logic state at the inputs of the N-channel input transistors, the output node either remains at its precharged state or is pulled low through the series of N-channel input transistors by a clocked N-channel transistor connected to ground.

In recent years, the predominant processing technology for manufacturing integrated circuits has been the complementary metal oxide silicon (CMOS) technology. Although CMOS technology offers various advantages, such as low power consumption and stability, over other types of processing technologies, one major drawback of CMOS circuits is their relatively slow speed. While device scaling may improve the speed of CMOS domino logic circuits, the degree of scaling is limited by the minimum allowable thickness of the gate dielectric of a transistor before electron and/or hole tunnelling between the gate electrode and the channel presents a prohibitively large current when the transistor is turned on. The present disclosure describes an improved domino logic circuit that can overcome the above-mentioned problem.

SUMMARY OF THE INVENTION

A domino logic circuit includes a precharge transistor, an isolation transistor, and multiple evaluate transistors. The precharge transistor, which is connected between the power supply and a dynamic node, receives a clock input. The isolation transistor is connected to ground and also receives the clock input. Each of the input transistors, which are coupled between the precharge transistor and the isolation transistor, receives a signal input. In accordance with a preferred embodiment of the present invention, the gate dielectric thickness of the evaluate transistors and the isolation transistor is less than the gate dielectric thickness of the precharge transistor.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
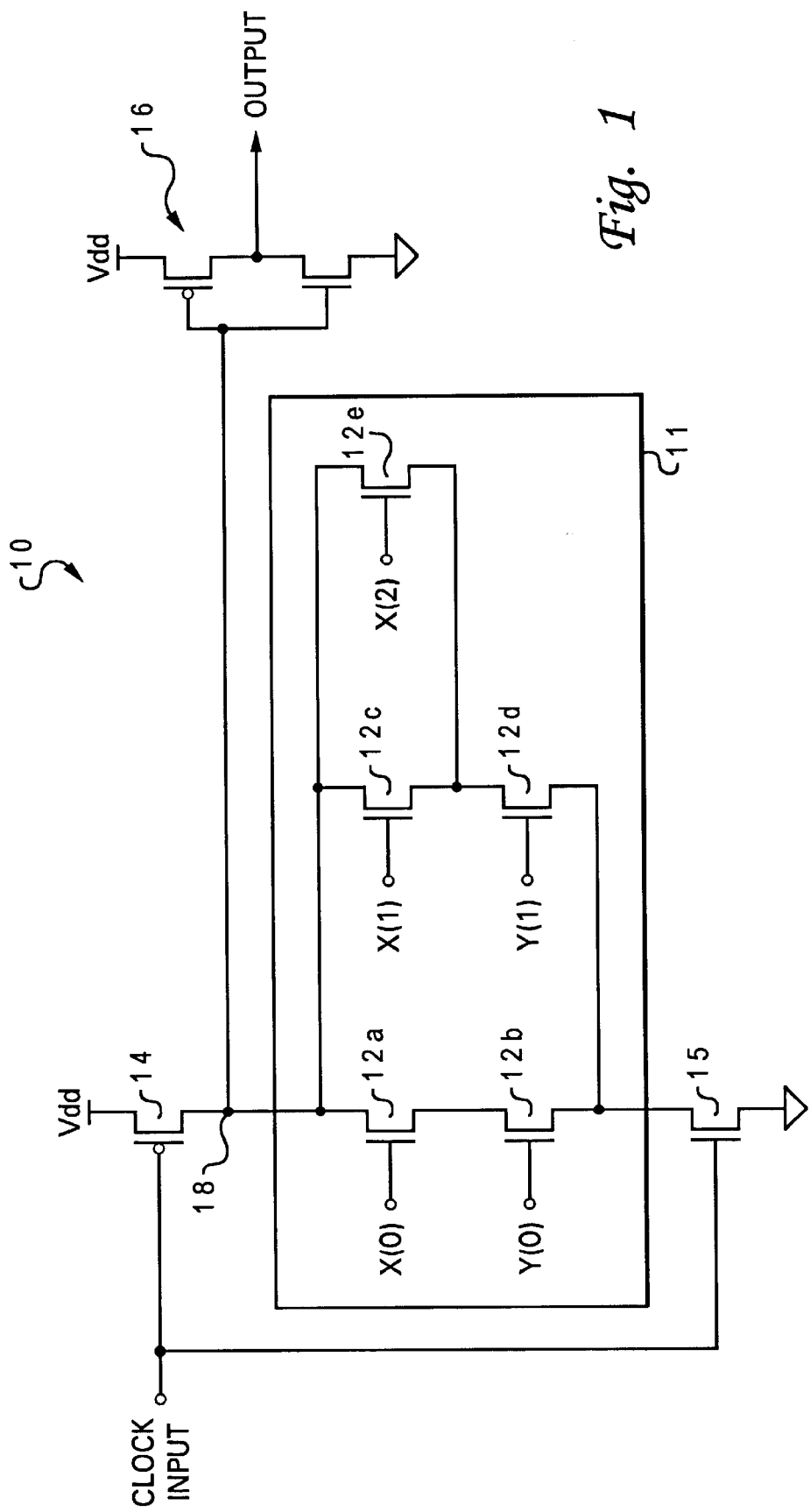
FIG. 1 is a circuit diagram of a first exemplary domino logic circuit to which a preferred embodiment of the present invention is applicable.

Referring now to the drawings and in particular to FIG. 1, there is depicted a circuit diagram of an exemplary domino logic circuit to which a preferred embodiment of the present invention is applicable. As shown, a domino logic circuit 10 includes a P-channel precharge transistor 14, an N-channel isolation transistor (or foot transistor) 15, and a transistor evaluate tree 11. All transistors within domino logic circuit 10 are preferably complementary metal-oxide semiconductor (CMOS) transistors.

In this circuit 10, transistor evaluate tree 11 contains evaluate transistors 12a–12e to implement the logic equation of $$[x(0) \cdot y(0)] + [[x(1)+x(2)] \cdot y(1)].$$

Input transistors 12a–12e are generally N-channel transistors, each having a respective input x( ) or y( ). When a logic high signal is applied to any one of inputs x( ) or y( ), an associated one of evaluate transistors 12a–12e is turned on. In other words, a conduction channel is formed between the source and drain terminals of the respective input transistor.

An output indication of the conduction within some of input transistors 12a–12e can be determined at node 18. Node 18 is also connected to precharge transistor 14 having a drain connected to a supply voltage $V_{dd}$. When precharge transistor 14 is driven into conduction by a logic low signal at its gate, the supply voltage $V_{dd}$, coupled through precharge transistor 14 will be transmitted to node 18. Node 18 is thus precharged to a voltage that represents a logic high. According to the conventional operation of domino logic circuits, when precharge transistor 14 is turned off, and thus the isolation transistor 15 clocked on, node 18 will remain precharged to the supply voltage $V_{dd}$ until some of evaluate transistors 12a–12e are driven into conduction. An inverter 16, formed by a P-channel/N-channel transistor pair, is connected between node 18 and the output of domino logic circuit 10. Thus, the complement of the logic value of the signal at node 18 appears at the output of domino logic circuit 10.

A clock input is connected to the gate of precharge transistor 14, as well as to the gate of isolation transistor 15. In this example, the drain of isolation transistor 15 is connected to the sources of input transistor 12b and input transistor 12d; and the source of isolation transistor 15 is connected to ground. Thus, when a logic high signal is applied to the gate of isolation transistor 15, isolation transistor 15 is driven into conduction, thereby grounding the sources of evaluate transistors 12b and 12d.

During operation, a precharge clock signal is applied at the clock input of domino logic circuit 10 by a precharge clock (not shown). At the low portion of the precharge clock signal, precharge transistor 14 is rendered conductive while isolation transistor 15 is made non-conductive, and node 18 is then precharged to the supply voltage $V_{dd}$. Conversely, at the high portion of the precharge clock signal, precharge transistor 14 is rendered non-conductive while isolation transistor 15 is made conductive, and the source of evaluate transistors 12*b* and 12*d* is then set to a logic low. It is during the high portion of the precharge clock signal when digital input signals should be applied to inputs x( ) and y( ). For example, if logic high signals are applied to inputs x(0) and y(0) only, input transistors 12*a* and 12*b* will be turned on such that isolation transistor 15 will pull node 18 to a logic low. Inverter 16 then inverts the logic low signal at node 18 to generate a logic high signal at the output of domino logic circuit 10. As a result, the above-mentioned logic function of domino logic circuit 10 is realized.

For CMOS processing technology, transistor gates are commonly made of polysilicon, and gate dielectric is commonly made of silicon dioxide. As a preferred embodiment of the present invention, the gate dielectric thickness of some of the transistors within domino logic circuit 10 are different from other transistors within domino logic circuit 10. Specifically, the gate dielectric thickness of some of the transistors within domino logic circuit 10 are reduced in order to improve the speed of domino logic circuit 10. For example, the gate dielectric thickness of evaluate transistors 12*a*–12*e* and isolation transistor 15 can be manufactured to be less than the gate dielectric thickness of precharge transistor 14. Furthermore, the gate dielectric thickness of the P-channel transistor in inverter 16 is less than the gate dielectric thickness of the N-channel transistor in inverter 16.

With the 1.2 V CMOS transistor technology, the "reduced" gate dielectric thickness for transistors such as evaluate transistors 12*a*–12*e* is preferably less than 15 Å, and the average gate dielectric thickness of other transistors such as precharge transistor 14 is preferably ranging from 17 Å–18 Å. Furthermore the nfet of inverter 16 should have the thick oxide, preferably ranging from 17Å–18 Å while the pfet of inverter 16 should have the thin oxide, preferably less than 15 Å. The process of manufacturing transistors having different gate dielectric thickness on a single wafer is well-known in the art.

Figure 2:
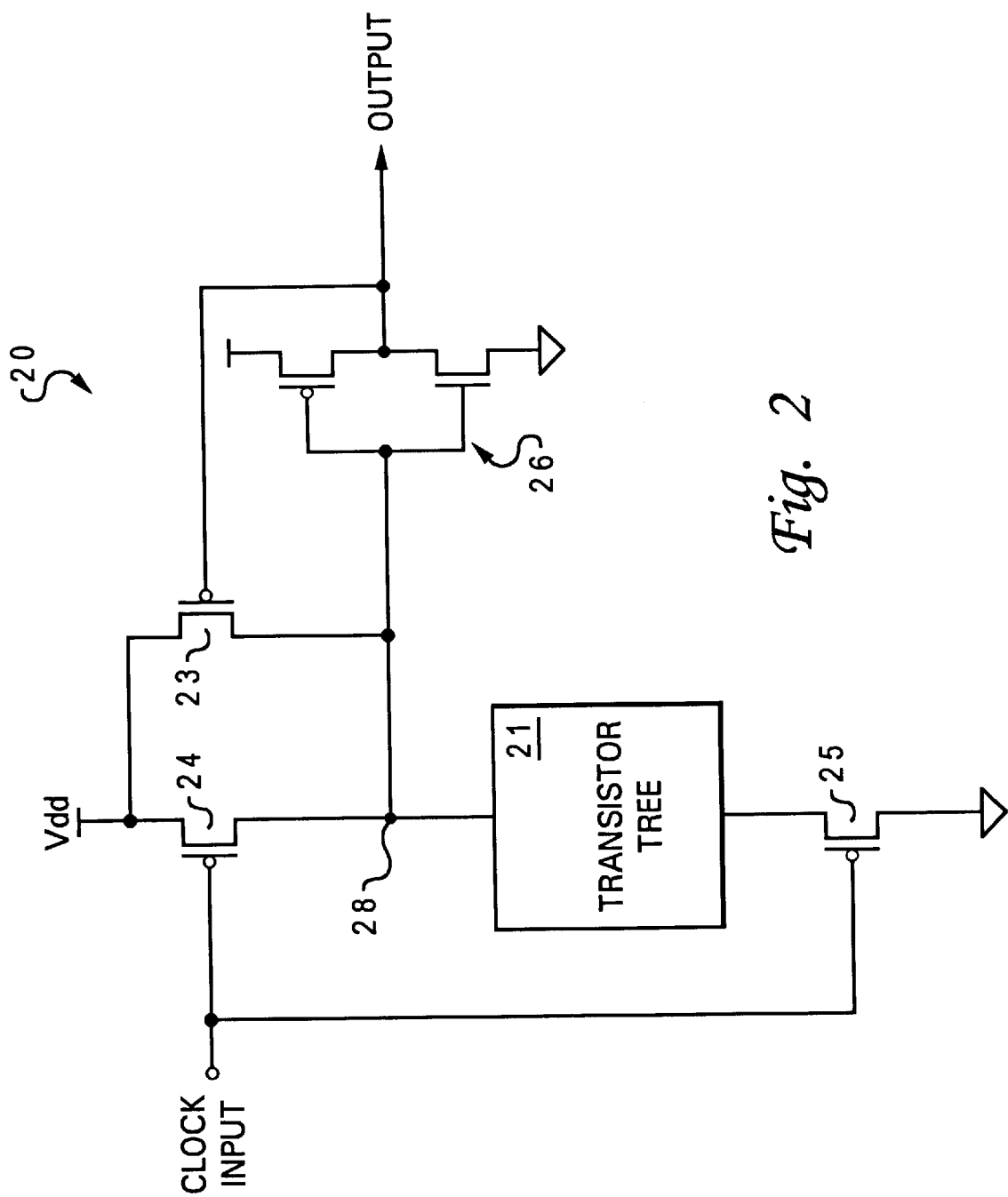
FIG. 2 is a circuit diagram of a second exemplary domino logic circuit to which a preferred embodiment of the present invention is applicable.

With reference now to FIG. 2, there is depicted a circuit diagram of a second exemplary domino logic circuit to which a preferred embodiment of the present invention is applicable. As shown, a domino logic circuit 20 includes a P-channel precharge transistor 24, an optional N-channel isolation transistor 25, and a transistor evaluate tree 21. Domino logic circuit 20 also includes an inverter 26, formed by a P-channel/N-channel transistor pair, connected between node 28 and the output of domino logic circuit 20. Thus, the complement of the logic value of the signal at node 28 appears at the output of domino logic circuit 20.

The difference between domino logic circuit 20 and domino logic circuit 10 from FIG. 1 is a P-channel keeper transistor 23 connected between the input and output of inverter 26. As a preferred embodiment of the present invention, the thickness of the gate dielectric of keeper transistor 23 should be the same as the gate dielectric of precharge transistor 24, which is thicker than the N-channel transistors within transistor evaluate tree 21.

In yet a further embodiment, the domino circuit of FIG. 2 can be employed in some circumstances without the use of the isolation nfets 15 in FIG. 1 or 25 in FIG. 2, as shown in FIG. 3.

As has been described, the present invention provides an improved domino logic circuit having a multiplicity of gate dielectric thickness. Although CMOS processing technology is used throughout this disclosure to illustrate the present invention, it is understood by those skilled in the art that the principle taught herein may also be applicable to all other similar processing technologies.

While the invention has been particularly shown and described with reference to a preferred embodiment, it will be understood by those skilled in the art that various changes in form and detail may be made therein without departing from the spirit and scope of the present invention.

What is claimed is:

1. A domino logic circuit, comprising:
   a precharge transistor connected to a power supply for receiving a clock input; and
   a plurality of evaluate transistors, coupled to said precharge transistor, such that the total gate dielectric thickness of said plurality of the evaluate transistors is less than the gate dielectric thickness of said precharge transistor.

2. The domino logic circuit of claim 1, wherein said transistors in said domino logic circuit are complementary-metal-oxide-semiconductor transistors.

3. The domino logic circuit of claim 1, wherein said precharge transistor is a P-channel transistor and said plurality of evaluate transistors are N-channel transistors.

4. The domino logic circuit of claim 1, wherein said domino logic circuit further includes an N-channel isolation transistor connected to ground, wherein said isolation transistor receives said clock input, wherein the gate dielectric thickness of said isolation transistor is less than the gate dielectric thickness of said precharge transistor.

5. The domino logic circuit of claim 1, wherein said domino logic circuit further includes an inverter, wherein the gate dielectric thickness of a P-channel transistor within said inverter is less than the gate dielectric thickness of an N-channel transistor within said inverter.

6. The domino logic circuit of claim 1, wherein said domino logic circuit includes a P-channel keeper transistor, wherein the gate dielectric thickness of said keeper transistor is the same as the gate dielectric thickness of said precharge transistor.

7. The domino logic circuit of claim 1, wherein the gate dielectric thickness of said precharge transistor ranges from 17 Å–18 Å.

8. The domino logic circuit of claim 1, wherein the gate dielectric thickness of said plurality of evaluate transistors are less than 15 Å.

* * * * *